United States Patent
Higuchi

(10) Patent No.: US 9,112,577 B2
(45) Date of Patent: Aug. 18, 2015

(54) RECEIVING APPARATUS THAT RECEIVES PACKET SIGNAL

(71) Applicant: SANYO ELECTRIC CO., LTD., Moriguchi-shi, Osaka (JP)

(72) Inventor: Keisuke Higuchi, Ichinomiya (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 122 days.

(21) Appl. No.: 13/768,791

(22) Filed: Feb. 15, 2013

(65) Prior Publication Data

US 2013/0156137 A1 Jun. 20, 2013

Related U.S. Application Data

(63) Continuation of application No. PCT/JP2011/007134, filed on Dec. 20, 2011.

(30) Foreign Application Priority Data

| Jan. 27, 2011 | (JP) | 2011-015715 |
| Feb. 28, 2011 | (JP) | 2011-041987 |
| Feb. 28, 2011 | (JP) | 2011-041988 |
| Feb. 28, 2011 | (JP) | 2011-041989 |
| Feb. 28, 2011 | (JP) | 2011-041990 |

(51) Int. Cl.
*H04B 1/16* (2006.01)
*H03G 3/30* (2006.01)

(52) U.S. Cl.
CPC ............... *H04B 1/16* (2013.01); *H03G 3/3073* (2013.01)

(58) Field of Classification Search
CPC .............. H03G 3/301; H03G 2201/10; H03G 2201/00; H03M 1/185; H04B 7/0811; H04B 1/16

See application file for complete search history.

(56) References Cited

U.S. PATENT DOCUMENTS

| 2004/0214529 A1* | 10/2004 | Terao .............................. 455/78 |
| 2006/0025090 A1* | 2/2006 | Shirakata et al. ............. 455/136 |
| 2006/0133544 A1* | 6/2006 | Kawada et al. ............... 375/343 |
| 2008/0279315 A1* | 11/2008 | Sato .............................. 375/345 |
| 2009/0016376 A1* | 1/2009 | Sawai ........................... 370/465 |
| 2009/0323591 A1* | 12/2009 | Takahashi et al. ............ 370/328 |
| 2010/0091911 A1* | 4/2010 | Sawai et al. .................... 375/340 |

(Continued)

FOREIGN PATENT DOCUMENTS

| JP | 2001-196957 A | 7/2001 |
| JP | 2005-202913 A | 7/2005 |
| JP | 2010-087791 A | 4/2010 |

OTHER PUBLICATIONS

International Search Report issued in Int'l Application No. PCT/JP2011/007134 dated Mar. 19, 2012.

*Primary Examiner* — Aristocratis Fotakis
(74) *Attorney, Agent, or Firm* — McDermott Will & Emery LLP

(57) ABSTRACT

An RF unit receives predetermined signals. The RF unit amplifies the received signals. A gain control unit controls the gain at the RF unit based on the amplified signal and has the RF unit use the controlled gain. The gain control unit performs different controls on the received signals, depending on the case when the received signal is a known signal placed in the beginning of packet signal and the case when the received signal is a signal other than the packet signal.

3 Claims, 17 Drawing Sheets

(56) References Cited

U.S. PATENT DOCUMENTS

| | | | |
|---|---|---|---|
| 2011/0200077 A1* | 8/2011 | Mitani et al. | 375/219 |
| 2012/0319775 A1* | 12/2012 | Nakamura | 330/129 |
| 2013/0070750 A1* | 3/2013 | Kim et al. | 370/350 |
| 2013/0163702 A1* | 6/2013 | Higuchi | 375/340 |

* cited by examiner

FIG.5

|  | STF PERIOD | OTHER THAN PACKET SIGNAL | |
|---|---|---|---|
| AVERAGE PERIOD | AP1 | AP2 | AP1<AP2 |
| TARGET VALUE | TV1 | TV2 | TV1>TV2 |

36

US 9,112,577 B2

RECEIVING APPARATUS THAT RECEIVES PACKET SIGNAL

CROSS REFERENCE TO RELATED APPLICATIONS

This application is a Continuation of PCT/JP2011/007134, filed on Dec. 20, 2011, which claims the priority of Japanese Patent Application No. 2011-015715, filed on Jan. 27, 2011, Japanese Patent Application No. 2011-041987, filed on Feb. 28, 2011, Japanese Patent Application No. 2011-041989, filed on Feb. 28, 2011, Japanese Patent Application No. 2011-041988, filed on Feb. 28, 2011, Japanese Patent Application No. 2011-041990, filed on Feb. 28, 2011, the disclosures of which are incorporated herein by reference.

BACKGROUND OF THE INVENTION

1. Field of the Invention

The present invention relates to a receiving technology, and it particularly relates to a receiving apparatus that receives packet signal.

2. Description of the Related Art

Road-to-vehicle communication has been under investigation in an effort to prevent collision accidents of vehicles on a sudden encounter at an intersection. In a road-to-vehicle communication, information on conditions at an intersection is communicated between a roadside unit and an in-vehicle unit. Such a road-to-vehicle communication requires installation of roadside units, which means a great cost of time and money. In contrast to this, an inter-vehicular communication, in which information is communicated between in-vehicle units, has no need for installation of roadside units. In that case, current position information is detected in real time by GPS (Global Positioning System) or the like and the position information is exchanged between the in-vehicle units. Thus it is determined on which of the roads leading to the intersection the driver's vehicle and the other vehicles are located.

When packet signals are received in wireless LAN compatible with the IEEE 802.11 standard and the like, the gain or amplification factor of an amplifier for amplifying the packet signals is set based on STF (Short Training Field) placed in the beginning of packet signal. The amplification suited to the received packet signal is not done if the accuracy in the setting of gain is low.

SUMMARY OF THE INVENTION

The present invention has been made in view of the foregoing circumstances, and a purpose thereof is to provide a technology for setting the gain suitable to a received packet signal.

In order to solve the above-described problems, a receiving apparatus according to one embodiment of the present invention includes: a receiving unit configured to receive a signal; an amplifier configured to amplify the signal received by the receiving unit; and a control unit configured to control a gain in the amplifier based on a signal amplified by the amplifier and configured to have the amplifier use the controlled gain. The control unit performs different controls on the signals received by the receiving unit, depending on a case when the received signal is a known signal placed in the beginning of packet signal or a case when the received signal is a signal other than the packet signal.

Optional combinations of the aforementioned constituting elements, and implementations of the invention in the form of methods, apparatuses, systems, recording media, computer programs and so forth may also be practiced as additional modes of the present invention.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 5 is a data structure of a table stored in a decision unit of FIG. 1;

DETAILED DESCRIPTION OF THE INVENTION

Figure 1:
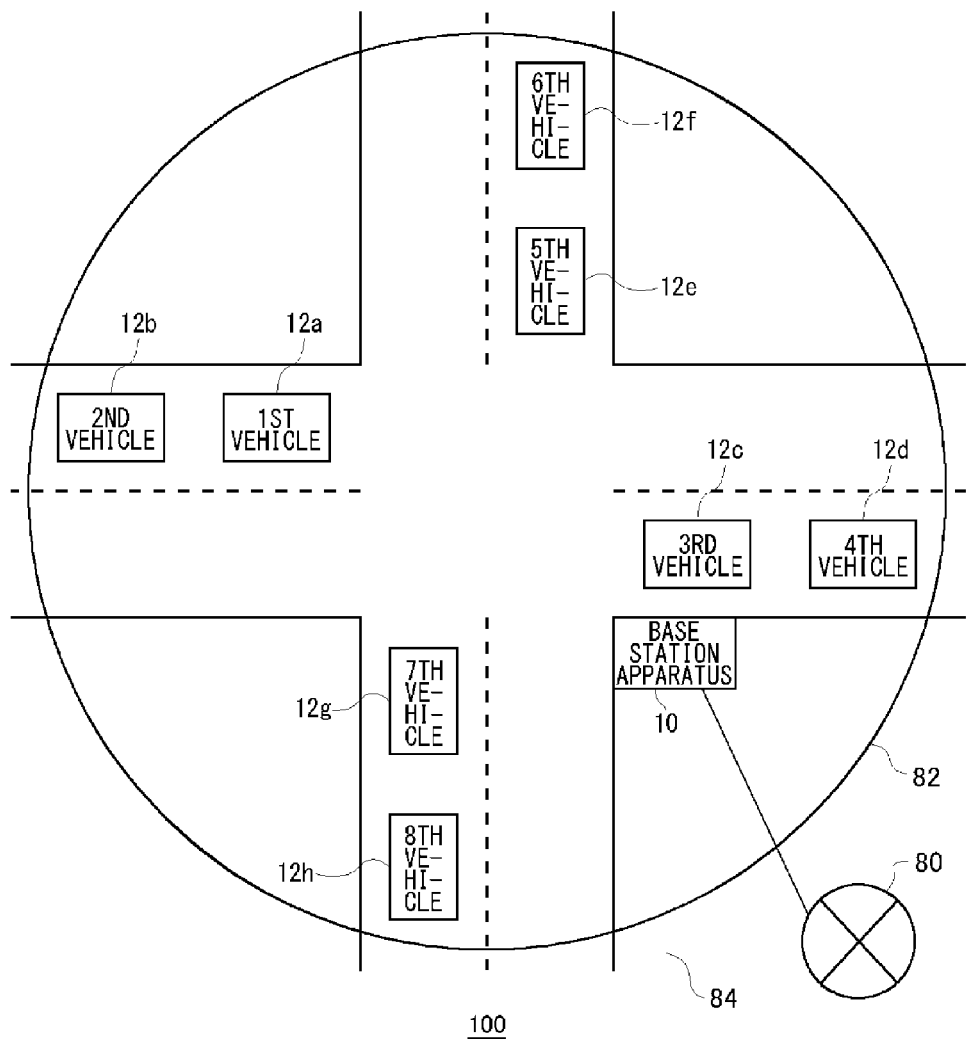
FIG. 1 shows a structure of a communication system according to an exemplary embodiment of the present invention.

The invention will now be described by reference to the preferred embodiments. This does not intend to limit the scope of the present invention, but to exemplify the invention.

Our knowledge underlying the present invention will be explained before exemplary embodiments of the present invention are explained in detail. An access control function called CSMA/CA (Carrier-Sense Multiple Access with Collision Avoidance) is used in wireless LAN (Local Area Network) compliant with IEEE 802.11 and the like. Thus, the same radio channel is shared by a plurality of terminal apparatuses. In such a scheme as CSMA, a packet signal is transmitted after it has been verified by carrier sense that other packet signals are not transmitted. Here, when wireless LAN is applied to the inter-vehicular communication such as ITS, a need arises to transmit information to a large indefinite number of terminal apparatuses, and therefore it is desirable that signals be sent by broadcast.

When a packet signal is received in wireless LAN compliant with IEEE 802.11 and the like, the gain of an amplifier for amplifying the packet signal is set based on STF (Short Training Field) placed at a beginning part of packet signal. If gain setting accuracy is low, amplification suited to the received packet signal will not be done. If, for example, the gain is low for a packet signal whose received power is low or the gain is high for a packet signal whose received power is high, the demodulation accuracy in demodulating the packet signal will deteriorate. Thus a gain best suited to the received packet signal is desirably set.

Exemplary embodiments of the present invention relate to a communication system that carries out not only an inter-vehicular communication between terminal apparatuses mounted on vehicles but also a road-to-vehicle communication from a base station apparatus installed in an intersection and the like to the terminal apparatuses. As the inter-vehicular communication, a terminal apparatus transmits, by broadcast, a packet signal in which the information such as the traveling speed and position of the vehicle is stored. And the other terminal apparatuses receive the packet signals and recognize the approach or the like of the vehicle based on these items of information. Further, the base station apparatus sends, by broadcast, a packet signal in which information concerning traffic jam and road repairing information are stored. The terminal apparatus recognizes the occurrence of traffic jam and a section and route where the road is under construction.

The format used in the communication system is similar to that used in wireless LAN and is such that STF is placed at a beginning part and LTF (Long Training Field) is placed following STF. LTF contains two OFDM symbols; the first (front) one is called "LTF1" and the second (rear) one is called "LTF2". As a packet signal is received in wireless LAN, the gain of the amplifier is generally controlled through automatic gain control (AGC) before the packet signal is demodulated and so forth. In order to reduce the processing amount and power consumption for AGC, the AGC processing is stopped while no packets is being received. Then, a maximum value is set as the gain in order that packet signals can be detected even though the AGC processing is stopped. If a packet signal whose received power is large is received in such a situation, the packet signal will tend to be distorted. If a packet signal with a small received power is being received, such a packet signal may not be amplified to a level required for demodulation if the gain is small. As a result, the receiving characteristics get degraded. It is therefore required that a gain best suited to the received packet be set.

To cope with this, a receiving function implemented in a base station apparatus and terminal apparatuses in the communication system according to the present exemplary embodiments (hereinafter referred to as "receiving apparatus") performs the following processing. That is, a receiving apparatus controls the gain even in a period during which no packet signals is received. More stable operation than the quick tracking of propagation environment is desired in such a period during which no packet signals is received. Thus, in such a period, a period over which the received signals are averaged (hereinafter this period will be referred to as "average period") is made longer, a target value of received signal after amplification is set to a smaller value, and the frequency of updating the gain is set lower by the receiving apparatus. Immediately after completion of the receiving of packet signals, the receiving apparatus uses the gain that was used before the receiving of the packet signal. If, on the other hand, the amplified packet signal is included in a target range during the receiving of packet signal, controlling the gain will be stopped and the gain will be fixed. If the gain becomes maximum during a control operation, the receiving apparatus will enlarge the target range for the purpose of preventing the gain from dropping and terminating the control operation as early as possible.

FIG. 1 shows a structure of a communication system 100 according to an exemplary embodiment of the present invention. FIG. 1 corresponds to a case thereof at an intersection viewed from above. The communication system 100 includes a base station apparatus 10, a first vehicle 12a, a second vehicle 12b, a third vehicle 12c, a fourth vehicle 12d, a fifth vehicle 12e, a sixth vehicle 12f, a seventh vehicle 12g, and an eighth vehicle 12h, which are generically referred to as "vehicle 12" or "vehicles 12", and a network 80. It is to be noted that each vehicle 12 has a not-shown terminal apparatus mounted therein. Also, an area 82 is formed around the base station apparatus 10, and an almost-unreachable area 84 is formed outside the area 82.

As shown in FIG. 1, a road extending in the horizontal, or left-right, direction and a road extending in the vertical, or up-down, direction in FIG. 1 intersect with each other in the central portion thereof. Note here that the upper side of FIG. 1 corresponds to the north, the left side thereof the west, the down side thereof the south, and the right side thereof the east. And the portion where the two roads intersect each other is the intersection. The first vehicle 12a and the second vehicle 12b are advancing from left to right, while the third vehicle 12c and the fourth vehicle 12d are advancing from right to left. Also, the fifth vehicle 12e and the sixth vehicle 12f are advancing downward, while the seventh vehicle 12g and the eighth vehicle 12h are advancing upward.

In the communication system 100, the base station apparatus 10 is installed at the intersection. The base station apparatus 10 receives the traffic jam information and the road repairing information from the network 80. The base station apparatus 10 generates a packet signal in which the traffic jam information and the road repairing information are stored, and broadcasts the thus generated packet signal containing such items of information. Note that the thus generated packet containing such items of information is broadcast to the terminal apparatuses that are present within the second range 212 formed around the base station apparatus 10. As a terminal apparatus mounted on the vehicle 12 receives a packet signal from the base station apparatus 10, the terminal apparatus extracts the traffic jam information and the road repairing information stored in the packet signal. The terminal apparatus conveys the extracted traffic jam information and road repairing information to a driver. The extracted traffic jam information and road repairing information may be conveyed through a display of the information on a monitor, for instance. The terminal apparatus acquires information regarding the present position through GPS or the like and generates a packet signal in which the information on the present position is stored. The terminal apparatus broadcasts the packet signal by CSMA/CA. As the terminal apparatus receives a packet signal from another terminal apparatus, the terminal apparatus notifies the driver that a vehicle 12 where the other terminal apparatus is mounted is approaching.

Figure 2:
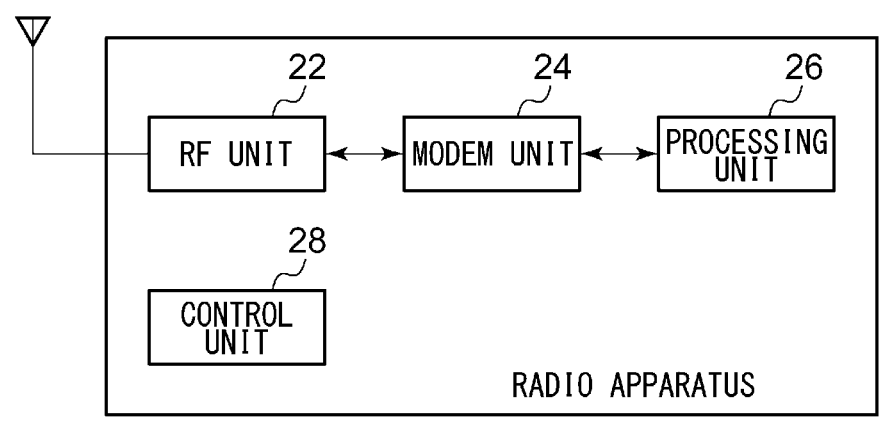
FIG. 2 shows a structure of a radio apparatus mounted on a vehicle shown in FIG. 1.

FIG. 2 shows a structure of a radio apparatus 20 mounted on the vehicle 12. The radio apparatus 20 includes an RF unit 22, a modem unit 24, a processing unit 26, and a control unit 28. The radio apparatus 20 corresponds to a terminal apparatus mounted on the vehicle 12 of FIG. 1 but it may correspond to the base station apparatus 10 of FIG. 1. Hereinafter, the terminal apparatuses and the base station apparatus 10 will be generically referred to as "radio apparatus 20" or "radio apparatuses 20" (first case), and there may also be cases where the terminal apparatus or the base station apparatus 10 is called "radio apparatus 20" (second case). However, no distinction will be made between the first case and the second case.

As a receiving processing, the RF unit 22 receives, through the antenna, packet signals transmitted from other radio apparatuses 20 (not shown). The RF unit 22 performs a frequency conversion on the received packet signal of a radiofrequency and thereby generates a packet signal of baseband. Further, the RF unit 22 outputs the baseband packet signal to the modem unit 24. Generally, a baseband packet signal is formed of an in-phase component and a quadrature component, and therefore it should be represented by two signal lines. However, it is represented by a single signal line here to make the illustration clearer for understanding. The RF unit 22 also includes an LNA (Low Noise Amplifier), a mixer, an AGC (Automatic Gain Control) unit, and an A/D converter.

As a transmission processing, the RF unit 22 performs a frequency conversion on the baseband packet signal inputted from the modem unit 24 and thereby generates a radiofrequency packet signal. Further, the RF unit 22 transmits, through the antenna, the radiofrequency packet signal in a road-to-vehicle transmission period. The RF unit 22 also includes a PA (Power Amplifier), a mixer, and a D-A converter.

As a receiving processing, the modem unit 24 demodulates the radiofrequency packet signal fed from the RF unit 22. Further, the modem unit 24 outputs the demodulation result to the processing unit 26. As a transmission processing, the modem unit 24 modulates the data fed from the processing unit 26. Further, the modem unit 24 outputs the modulation result to the RF unit 22 as a baseband packet signal. It is to be noted here that the communication system 100 is compatible with the OFDM (Orthogonal Frequency Division Multiplexing) modulation scheme and therefore the modem unit 24 performs FFT (Fast Fourier Transform) as a receiving processing and performs IFFT (Inverse Fast Fourier Transform) as a transmission processing also.

Figure 3:
FIG. 3 shows a format of packet signal defined in the communication system of FIG. 1.

A description is now given of the format of packet signal that is to be modulated and demodulated by the modem unit 24. FIG. 3 shows a format of packet signal defined in the communication system 100. As shown in FIG. 3, STF is assigned to the beginning of packet signal. And the STF is followed by GI2, LTF1, LTF2, SIG, and Data. STF is a signal of 160 samples where a signal of 16 samples is repeated ten times. That is, in STF, a signal pattern whose period is shorter than that of LTF1 described later is repeated ten times. LTF1 and LTF2 are periodic of 64 samples in common with each other and are of the identical signal pattern. GI2 is a guard interval for LTF1 or LTF2 and is of 32 samples. GI2, LTF1, and LTF2 constitute LTF. Note here that LTF may be constructed of LTF1 and LTF2. SIG is a control signal and is of 80 samples. This 80-sample SIG contains a guard interval of 16 samples. Refer back to FIG. 2.

As a receiving processing, the processing unit 26 receives the demodulation result by the modem unit 24. The processing unit 26 performs a processing according to the demodulation result. If, for example, the demodulation result is information concerning the present position of the vehicle 12 in which the other radio apparatus is mounted, the processing unit 26 will convey the approach or the like of the not-shown other vehicle 12 to the driver via a monitor or speaker. If the demodulation result is the traffic jam information and the road repairing information, the processing unit 26 will convey them to the driver via the monitor or speaker. And the present position, traveling direction, traveling speed and so forth of a not-shown vehicle 12, namely the vehicle 12 carrying the radio apparatus 20 are acquired based on data supplied from the aforementioned not-shown components of the processing unit 26. Hereinafter the present position, traveling direction, traveling speed and so forth will be generically referred to as "present position" or "positional information". The present position thereof is indicated by the latitude and longitude. Known art may be employed to acquire them and therefore the description thereof is omitted here. The processing unit 26 generates a packet signal in which the present position is stored. The processing unit 26 outputs the packet signal to the modem unit 24. The control unit 28 controls the operation timing of the radio apparatus 20.

These structural components may be implemented hardwarewise by elements such as a CPU, memory and other LSIs of an arbitrary computer, and softwarewise by memory-loaded programs or the like. Depicted herein are functional blocks implemented by cooperation of hardware and software. Therefore, it will be obvious to those skilled in the art that the functional blocks may be implemented by a variety of manners including hardware only or a combination of hardware and software.

Figure 4:
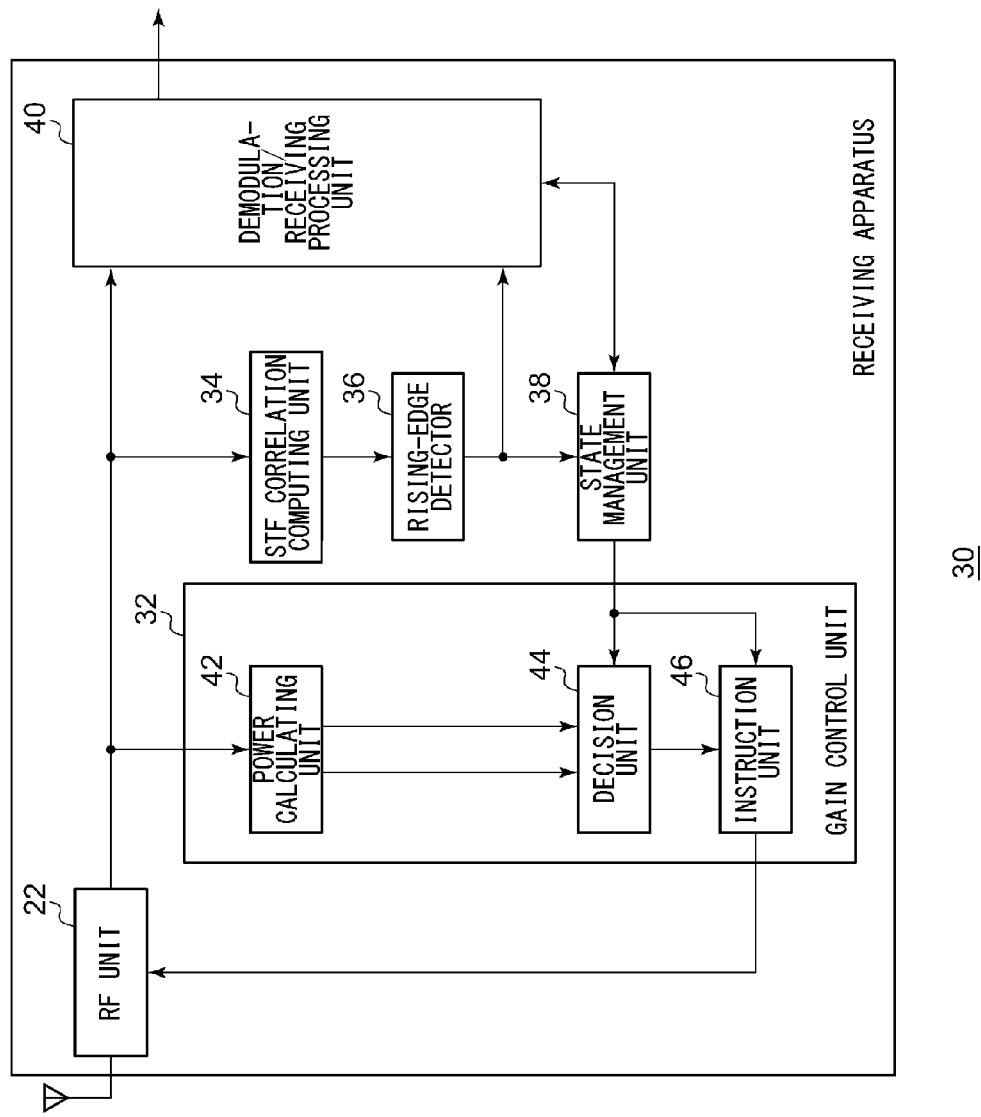
FIG. 4 shows a structure of a receiving apparatus in the radio apparatus of FIG. 1.

FIG. 4 shows a structure of a receiving apparatus 30 in the radio apparatus 20. The receiving apparatus 30 includes an RF unit 22, a gain control unit 32, an STF correlation computing unit 34, a rising-edge detector 36, a state management unit 38, and a demodulation/receiving processing unit 40. The gain control unit 32 includes a power calculating unit 42, a decision unit 44, and an instruction unit 46.

As described above, the RF unit 22 receives predetermined signals through the antenna. The signals received by the RF unit 22 may be desired packet signals as shown in FIG. 3 and interference signals other than the desired packet signals. The RF unit 22 is provided with a not-shown amplifier that amplifies the signal received by the RF unit 22. Note that there are cases when the amplifier amplifies the packet signal. The gain of the amplifier is set by the gain control unit 32 described later. The RF unit 22 outputs the amplified baseband signal.

The power calculating unit 42 receives the input of the amplified baseband signal from the RF unit 22. The power calculating unit 42 averages the magnitudes of amplified baseband signals. Here, a moving average is taken over an average period. Two kinds of average period are defined here. For convenience, a shorter period of two kinds thereof is called a "first average period" and a longer period a "second average period". Note also that the first average period is shorter than the period of STF. As a result, the power calculating unit 42 sequentially outputs an average value obtained over the first average period and an average value obtained over the second average period.

The decision unit 44 sequentially receives from the power calculating unit 42 the inputs of the average value over the first average period and the average value over the second average period. The decision unit 44 selects either the average value over the first average period or the average value over the second average period according to the notification from the state management unit 38. The decision unit 44 controls the gain of the amplifier based on the selected average value. The gain is determined such that the magnitude of the average value is brought close to a target value. The processing performed by the decision unit 44 will be later discussed in detail. The decision unit 44 sequentially outputs the thus determined gain values to the instruction unit 46. The instruction unit 46 instructs the amplifier to use the gain, determined by the decision unit 44, at a predetermined frequency. That is, the instruction unit 46 has the amplifier use the controlled gain.

The STF correlation computing unit 34 receives the input of the amplified baseband signal from the RF unit 22. The STF correlation computing unit 34 computes cross-correlation between the amplified baseband signal and the pattern of 16 samples in STF. The structure of a correlator for computing the cross-correlation therebetween is known in the art and therefore the repeated explanation thereof is omitted here. The STF correlation computing unit 34 sequentially outputs the cross-correlation to the rising-edge detector 36.

The rising-edge detector 36 receives the input of a correlation value from the STF correlation computing unit 34. The rising-edge detector 36 detects the receiving of STF in the packet signal. This corresponds to detecting the rising edge of the packet signal. More specifically, if the cross-correlation value becomes larger than a threshold value, the rising-edge detector 36 will determine that a rising edge has been detected and then convey the decision result to the state management unit 38. To compute the rising edge thereof, the STF correlation computing unit 34 and the rising-edge detector 36 may monitor the signal strength such as RSSI (Received Signal Strength Indication) instead of computing the cross-correlation.

The state management unit 38 manages the receiving state of the receiving apparatus 30. More specifically, the state management unit 38 manages the state of whether the packet is being received or not. If a notification is received from the rising-edge detector 36 while no packet signals is being received, the state management unit 38 will recognize a transition to the state in which packet signals are being received. For that purpose, the state management unit 38 is aware of the format of the packet signal shown in FIG. 3 beforehand. Thus, in the state where the packet signals are being received, the state management unit 38 identifies if STF, LTF1, LTF2, SIG, or Data is being received. Thus, the state management unit 38 measures the timings after the start of the receiving of packet signal. To identify these, the state management unit 38 may use the demodulation result and the decoding result fed from the demodulation/receiving processing unit 40. The state management unit 38 conveys, to the instruction unit 46, the state where STF is being received and the state where no packet signals is being received.

The decision unit 44 receives, from the state management unit 38, the notification regarding the state where STF is being received and the notification regarding the state where no packet signals is being received. Upon receiving the notification regarding the state where STF is being received, the decision unit 44 selects an average value taken over the first average period. Upon receipt of the notification regarding the state where no packet signals is being received, the decision unit 44 selects an average value taken over the second average period. This corresponds to varying the length of average period by the power calculating unit 42 according to the state of whether STF is being received or no packet signals is being received. In particular, the former average period is set longer than the later average period.

Upon receiving the notification regarding the state where STF is being received, the decision unit 44 sets a predetermined target value (hereinafter referred to as a "first target value"). Upon receiving the notification regarding the state where no packet signals is being received, the decision unit 44 sets a target value, which is smaller than the first target value, (hereinafter referred to as a "second target value"). That is, decision unit 44 changes the magnitude of the target value according to the state of whether STF is being received or no packet signals is being received. In this manner, the power calculating unit 42 performs different controls depending on the states.

FIG. 5 is a data structure of a table stored in the decision unit 44. As shown in FIG. 5, the table is comprised of an STF period column 200 and an other-than-packet-signal column 202. A first average period (AP1) to be used in the state where STF is being received and a first target value (TV1) are shown in the STF period column 200. A second average period (AP2) to be used in the state where no packet signals is being received and a second target value (TV2) are shown in the other-than-packet-signal column 202. As described earlier, AP1<AP2 and TV1>TV2. The decision unit 44 selects the values indicated in the STF period column 200 or those indicated in the STF period column 200 depending on the notification received from the state management unit 38. Refer back to FIG. 4.

A further detailed description is now given hereunder of the processing performed by the decision unit 44 in the state where STF is being received. The decision unit 44 sets a target range in such a manner as to allow a marginal width around a given target value. The decision unit 44 adjusts the gain until when an average value is contained in the target range. If, for example, the average value is lower than a lower limit, the decision unit 44 will increase the gain; if the average value is higher than an upper limit, the decision unit 44 will reduce the gain. Such an adjustment will be made repeatedly during the period of STF.

Figure 6A:
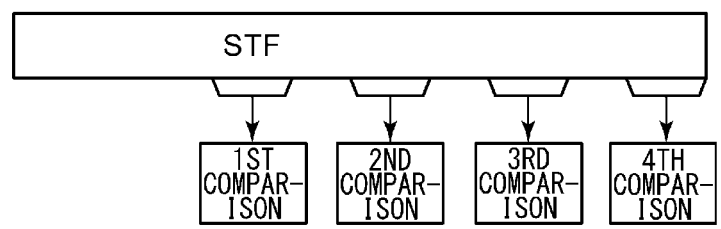
FIGS. 6A and 6B show an operational overview of a decision unit of FIG. 3.
Figure 6B:
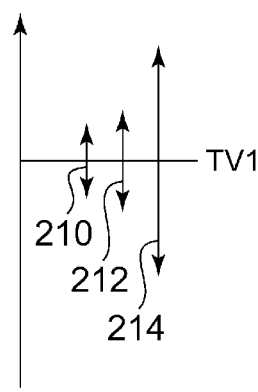

FIGS. 6A and 6B show an operational overview of the decision unit 44. FIG. 6A indicates a comparative operation in the period of STF in the decision unit 44. The horizontal axis corresponds to time. After a predetermined period has elapsed, a first comparison is made such that an average value is compared against a target range. After a predetermined period has elapsed after the gain was controlled based on the first comparison, a second comparison is made such that the average value is again compared against the target value. The reason why the process waits for a certain period of time as described above is that time for response (response period) at the amplifier is taken into consideration. Such a process as described above is carried out repeatedly up to a fourth comparison in FIG. 6A. Note that the number of comparisons is not limited to four times. FIG. 6B will be explained later. Refer back to FIG. 4.

If an average value is contained in the target value, the decision unit 44 will fix the gain. The thus fixed gain is used over the remaining period of the packet signal. Thus, if, for example, the process is in the middle of any of the first to third comparisons in the period of STF, the decision unit 44 will fix the gain and then omit the remaining comparisons. If the average value is still not contained in the target range at the last comparison timing in the period of STF, namely by the end of the fourth comparison of FIG. 6A, the decision unit 44 will stop the receiving of said packet signal. In other words, the packet signal will be discarded because an appropriate gain has not been set. To reduce such a probability of discarding the packet signal, the decision unit 44 makes the width of target range, to be used at the last timing in the period of STF, wider than the previous width thereof.

FIG. 6B shows the first target values (TV1) and their target ranges set by the decision unit 44. A first range 210 is the target range used for the comparisons except for the last comparison in the period of STF, namely for the first to third comparisons of FIG. 6A. As mentioned earlier, the first range 210 is so set as to allow a marginal width around TV1. A second range 212 is the target range used for the last comparison in the period of STF, namely for the fourth comparison of FIG. 6A. The width of the second range 212 is so defined as to be wider than that of the first range 210. Refer back to FIG. 4. The above description corresponds to a case where the gain is less than the maximum value.

If, on the other hand, the gain is at the maximum value when comparison is made, the decision unit 44 will perform the following processing. If the gain is at the maximum value when the comparison is made, the decision unit 44 will set a target range whose width is wider than the widths of the target ranges at the time the gain is smaller than the maximum value (hereinafter, such a target value as this will be referred to as a "third range"). In FIG. 6B, the width of a third range 214 is so defined as to be wider than both that of the first range 210 and that of the second range 212. Note that the width of the third range 214 needs only to be wider than that of the first range 210 and therefore the width of the third range 214 may be narrower than or equal to that of the second range 212. In this manner, the decision unit 44 changes the width of a target range between when the gain is less than the maximum value and when the gain is at the maxim value. Refer back to FIG. 4.

The instruction unit 46 receives, from the state management unit 38, the notification regarding the state where STF is being received and the notification regarding the state where no packet signals is being received. Immediately after it received the notification regarding the state where STF is being received and immediately after it received the notification regarding the state where no packet signals is being received, the instruction unit 46 instructs the RF unit 22 to use an initial value of the gain. The former corresponds to the timing with which the receiving of packet signal starts and the latter corresponds to the timing with which the receiving of packet signal ends.

Figure 7:
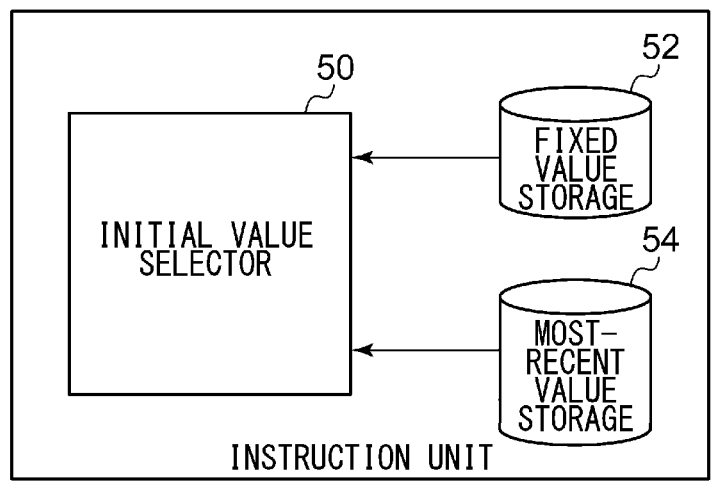
FIG. 7 shows a structure of an instruction unit shown in FIG. 4.

FIG. 7 shows a structure of the instruction unit 46. The instruction unit 46 includes an initial value selector 50, a fixed value storage 52, and a most-recent value storage 54. The fixed value storage 52 stores predetermined gains (hereinafter referred to as "fixed values" or "fixed value"). The most-recent value storage 54 stores a most recent value of the gain that has been updated by the decision unit 44 in the state where no packet signals is being received (hereinafter referred to as the "most recent value"). The most recent value is updated whenever the gain is updated. If the notification regarding the state where STF is being received is received while the notification regarding the state where no packet signals is being received is received, the initial value selector 50 will extract a fixed value from the fixed value storage 52 and instruct the RF unit 22 to use the fixed value. This corresponds to starting to perform control by the gain control unit 32 using the fixed value as the initial value when the receiving of packet signal starts.

If, on the other hand, the notification regarding the state where no packet signals is being received is received while the packet signal is being received, the initial value selector 50 will extract the most recent value from the most-recent value storage 54 and instruct the RF unit 22 to use the most recent value. This corresponds to starting to perform control by the gain control unit 32 using the most recent value as the initial value when the receiving of packet signal starts. The most recent value may be said to be the final value among the gains used in the past for the signals other than the packet signals.

Figure 8:
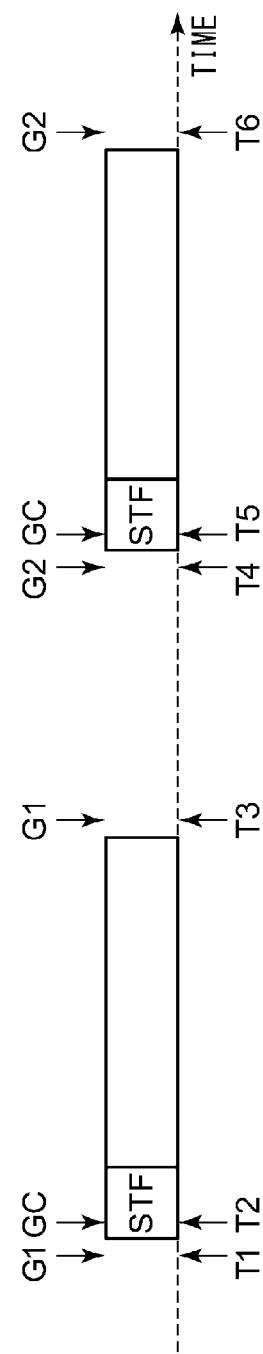
FIG. 8 shows an operational overview of the instruction unit shown in FIG. 7.

Such processings are now described hereunder based on FIG. 8. FIG. 8 shows an operational overview of the instruction unit 46. The horizontal axis indicates time. "T1" is the timing with which signals other than the packet signals are being received. At this time, the gain is "G1" that is the most recent value. Next, "T2" is the timing with which the receiving of packet signal starts. At this time, the gain is "GC" that corresponds to the aforementioned fixed value. During a period of STF, the gain is controlled with the "GC" as the initial value, and then the remaining period is amplified with the resulting gain. "T3" is the timing with which the receiving of packet signal ends. The gain at this time is set to the then-most recent value "G1".

In a period during which a signal other than the packet signal is being received, the gain is controlled with the "G1" as the initial value; with the timing "T4", the gain is updated to "G2". The "G2" is now the most recent value. "T5" is the timing with which the receiving of packet signal starts again. At this time, too, the gain is "GC". "T6" is the timing with which the receiving of packet signal ends again. At this time, the gain is set to "G2" that is the then-most recent value. This corresponds to the following. That is, when the receiving of a packet signal, control is started using the final value of gain, which has been used before the receiving of said packet signal, as the initial value. Refer back to FIG. 4.

As described earlier, the instruction unit 46 instructs the amplifier to use the gain, determined by the decision unit 44, at a predetermined frequency. A description is now given of the frequency at which the gain is used. The instruction unit 46 changes the frequency, at which the gain is updated, depending on a case when the instruction unit 46 is receiving the notification regarding the state where STF is being received or the notification regarding the state where no packet signals is being received. More specifically, the instruction unit 46 lowers the update frequency when it is receiving the notification regarding the state where no packet signals is being received than the update frequency when it is receiving the notification regarding the state where STF is being received.

Figure 9:
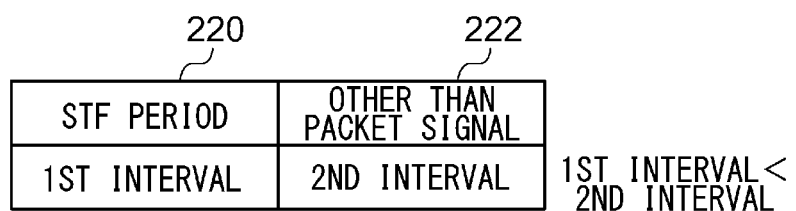
FIG. 9 is a data structure of a table stored in an instruction unit of FIG. 4.

FIG. 9 is a data structure of a table stored in the instruction unit 46. As shown in FIG. 9, the table is comprised of an STF period column 220 and an other-than-packet-signal column 222. A first interval indicated in the STF period column 220 is the interval at which the gain is updated when the notification regarding the state where STF is being received is received. A second interval indicated in the other-than-packet-signal column 222 is the interval at which the gain is updated the notification regarding the state where no packet signals is being received is received. The first interval is shorter than the second interval. Here, the first interval is derived based on the first average period and the response period required by the amplifier, and the second interval is derived based on the second average period, the response period required by the amplifier and a waiting time period.

The second interval differs greatly from the first interval in the following two points. The first point is that the second average period is used instead of the first average period and the second point is that the waiting time period is appended in the second period. The waiting time period is set to an arbitrary time length. Refer back to FIG. 4. The instruction unit 46 instructs the use of gain at each first interval or second interval according to the content of notification. As the gain is fixed by the decision unit 44, the instruction unit 46 instructs the RF unit 22 to use the fixed gain until the packet signal ends. The demodulation/receiving processing unit 40 carries out the receiving processing in the modem unit 24 and the processing unit 26 of FIG. 2.

The present invention has been described based on the exemplary embodiments. The exemplary embodiments are intended to be illustrative only, and it is understood by those skilled in the art that various modifications to constituting elements and processes as well as arbitrary combinations thereof could be further developed and that such modifications and combinations are also within the scope of the present invention.

Figure 10:
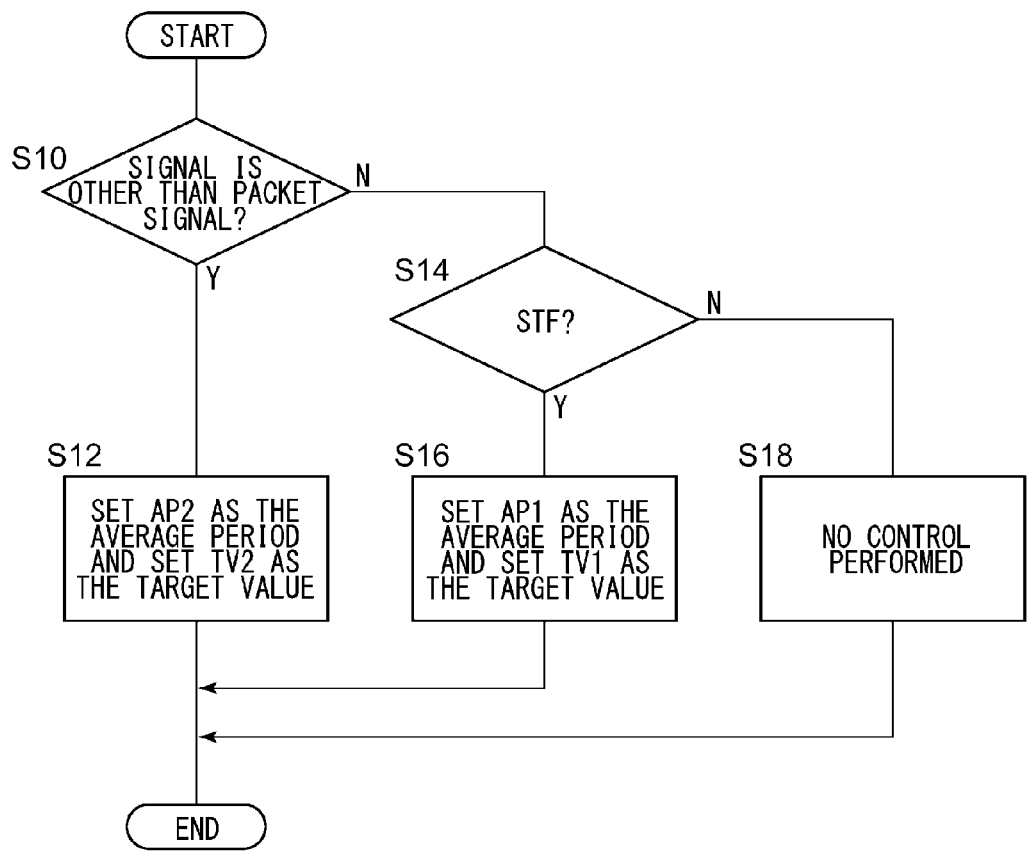
FIG. 10 is a flowchart showing a procedure, for setting an average period and a target value, performed by the receiving apparatus of FIG. 4.

An operation of the communication system 100 configured as above is now described. FIG. 10 is a flowchart showing a procedure, for setting an average period and a target value, performed by the receiving apparatus 30. If a signal other the packet signals is received (Y of S10), the decision unit 44 will set AP2 as the average period and set TV2 as the target value (S12). If, on the other hand, the signal other the packet signals is not received (N of S10) but STF is received (Y of S14), the decision unit 44 will set AP1 as the average period and set TV1 as the target value (S16). STF is not received (N of S14), the decision unit 44 will not perform controlling (S18).

Figure 11:
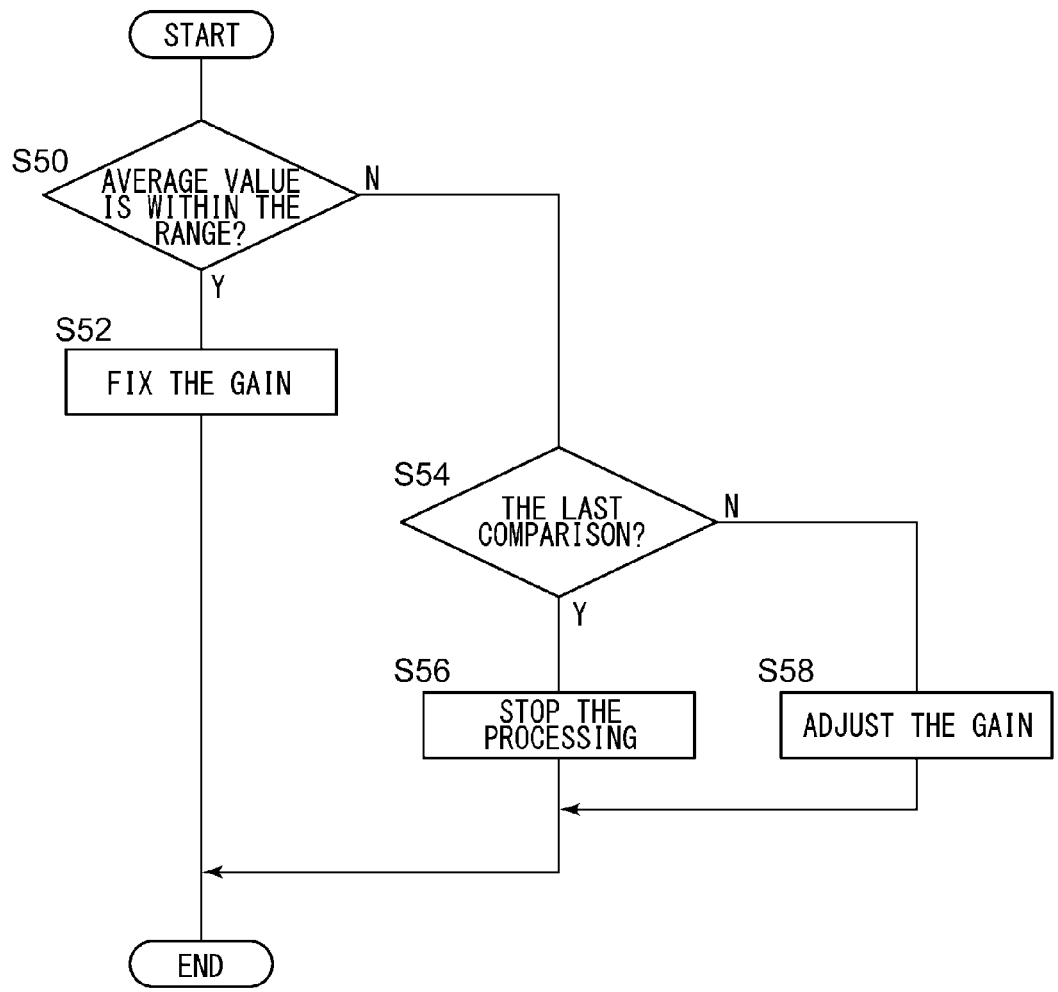
FIG. 11 is a flowchart showing a procedure, for controlling the gain, performed by the receiving apparatus of FIG. 4.

FIG. 11 is a flowchart showing a procedure, for controlling the gain, performed by the receiving apparatus 30. If the average value is within a target range (Y of S50), the decision unit 44 will fix the gain (S52). If, on the other hand, the average value is not within the target range (N of S50) and the comparison is the last comparison (Y of S56), the decision unit 44 will stop the processing (S56). If the comparison is not the last comparison (N of S56), the decision unit 44 will adjust the gain (S58).

Figure 12:
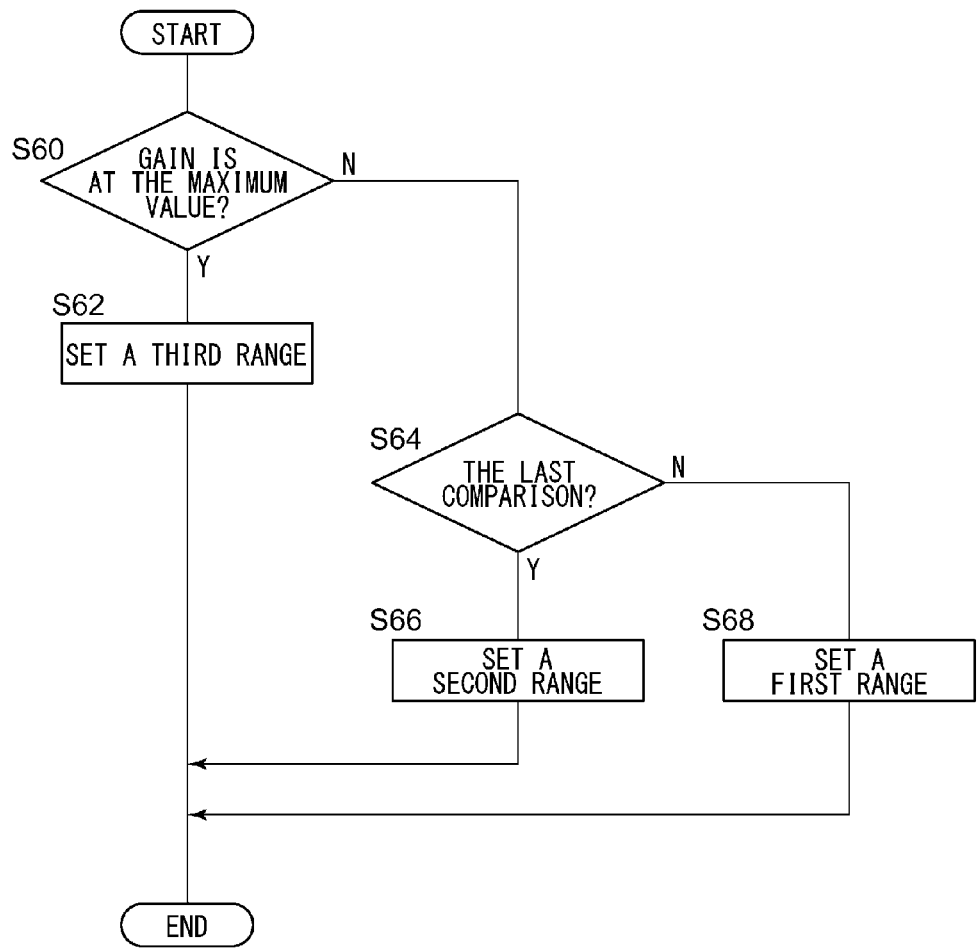
FIG. 12 is a flowchart showing a procedure, for setting ranges, performed by the receiving apparatus of FIG. 4.

FIG. 12 is a flowchart showing a procedure, for setting the ranges, performed by the receiving apparatus 30. If the gain is at the maximum value (Y of S60), the decision unit 44 will set the third rage (S62). If, on the other hand, the gain is not the maximum value (N of S60) and the comparison is the last comparison (Y of S64), the decision unit 44 will set the second range (S66). If the comparison is not the last comparison (N of S64), the decision unit 44 will set the first range (S68).

Figure 13:
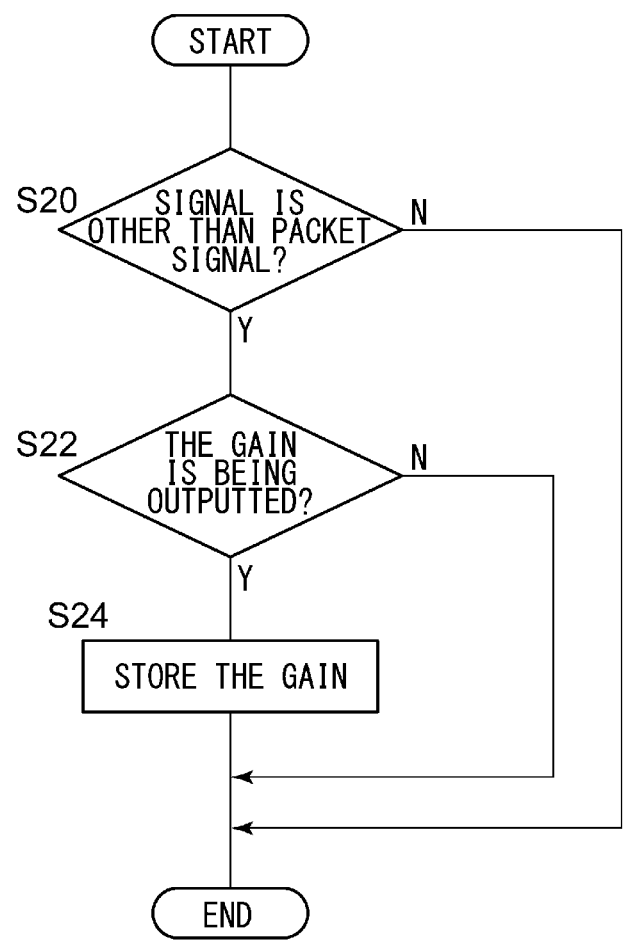
FIG. 13 is a flowchart showing a procedure, for storing the gain, performed by the receiving apparatus of FIG. 4.

FIG. 13 is a flowchart showing a procedure, for storing the gain, performed by the receiving apparatus 30. If a signal other than the packet signals is received (Y of S20) and the instruction unit 46 outputs the gain (Y of S22), the gain will be stored in the most-recent value storage 54 (S24). If the signal other the packet signals is not received (N of S20) or the instruction unit 46 does not output the gain (N of S22), the processing will be completed.

Figure 14:
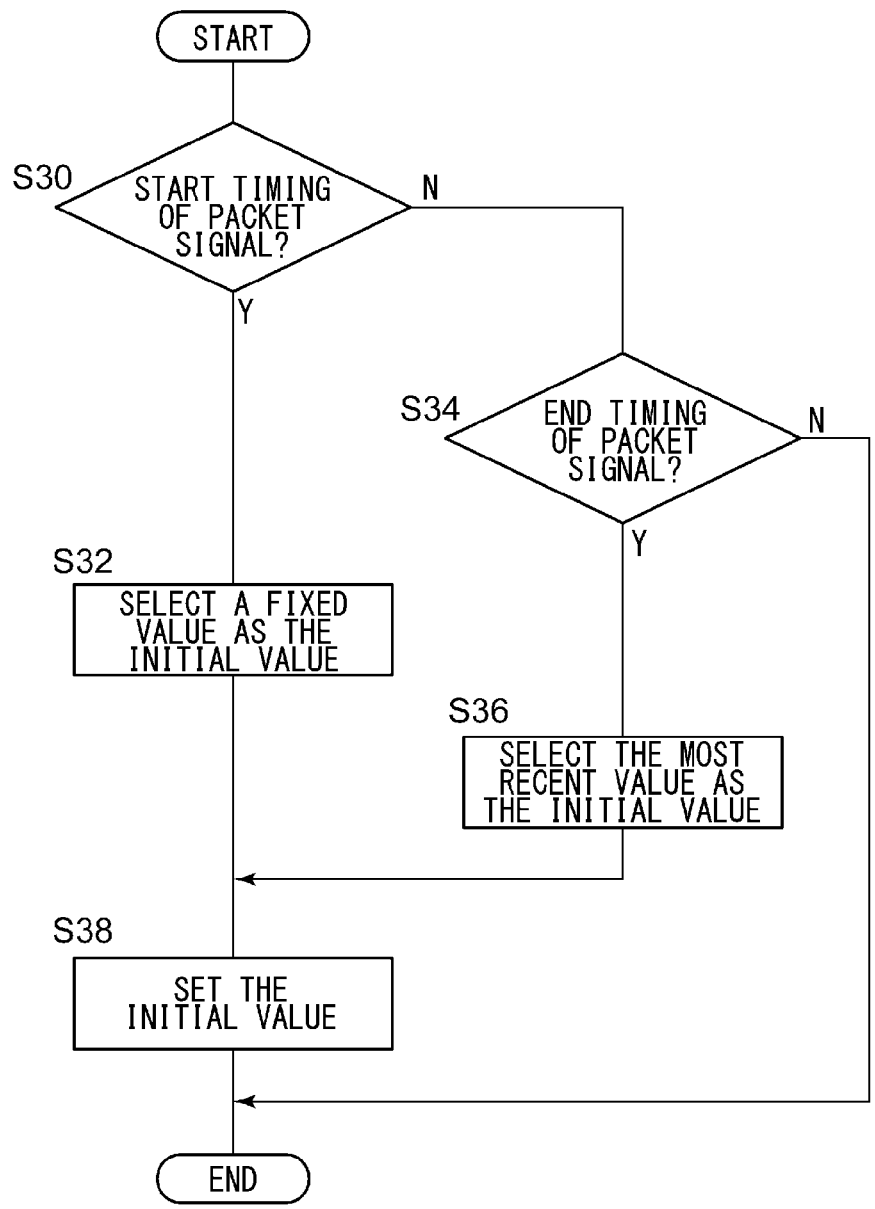
FIG. 14 is a flowchart showing a procedure, for setting an initial value, performed by the receiving apparatus of FIG. 4.

FIG. 14 is a flowchart showing a procedure, for setting an initial value, performed by the receiving apparatus 30. If the timing is the start timing of packet signal (Y of S30), the initial value selector 50 selects a fixed value as the initial value (S32). If the timing is not the start timing of packet signal (N of S30) and is the end timing of packet signal (Y of S34), the initial value selector 50 will set the most recent value as the initial value (S36). The instruction unit 46 sets the initial value in the amplifier (S38). If the timing is not the end timing of packet signal (N of S34), the processing will be completed.

Figure 15:
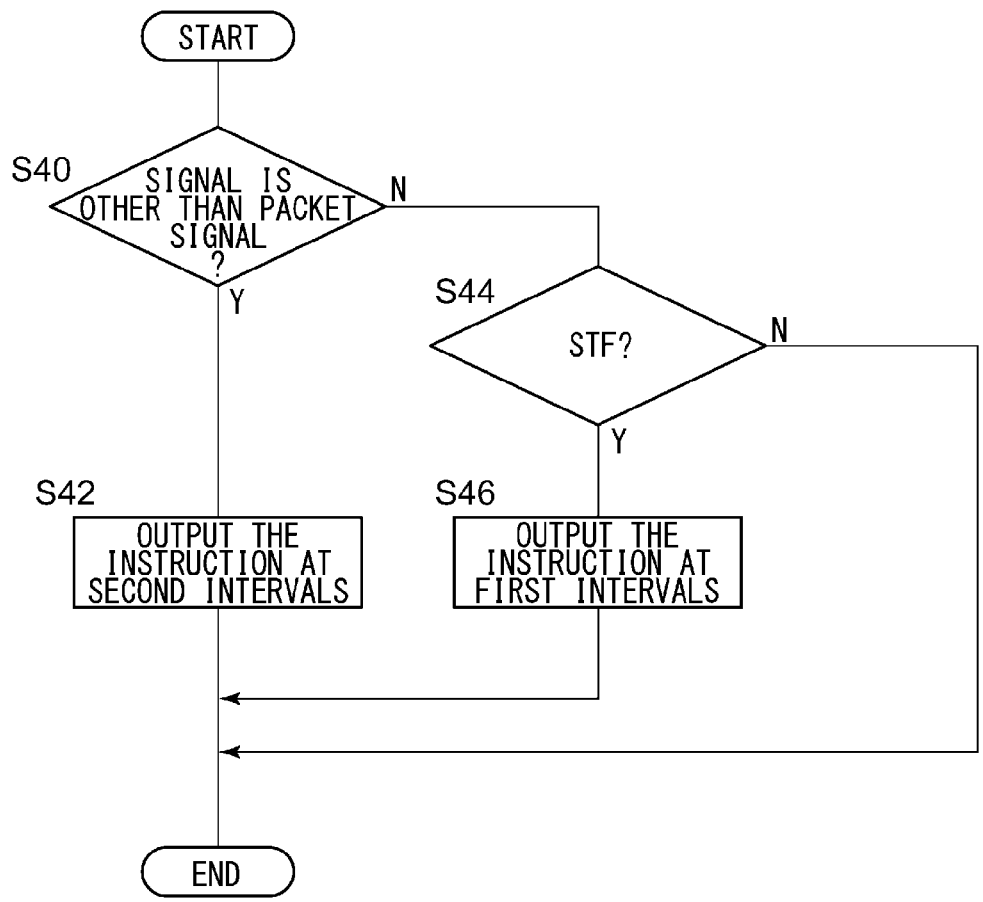
FIG. 15 is a flowchart showing an instructing procedure performed by the receiving apparatus of FIG. 4.

FIG. 15 is a flowchart showing an instructing procedure performed by the receiving apparatus 30. If a signal other than the packet signals is received (Y of S40), the instruction unit 46 will output the instruction at the second intervals (S42). If, on the other hand, the signal other the packet signals is not received (N of S40) and STF is received (Y of S44), the instruction unit 46 will output the instruction at the first intervals (S46). If STF is not received (N of S44), the processing will be completed.

A description is now given of modifications of the exemplary embodiments. A modification relates to the processing carried out by the instruction unit. If the notification regarding the state where STF is being received is received while the notification regarding the state where no packet signals is being received is received, the instruction unit according to the exemplary embodiment starts to control the gain control unit 32 using a fixed value as the initial value. If, on the other hand, the notification regarding the state where STF is being received is received while the notification regarding the state where no packet signals is being received is received, the instruction unit according to the modification will stat to control the gain control unit 32 using the most recent value as the initial value. This processing is similar to that performed in the case when the notification regarding the state where no packet signals is being received is received while the packet signal is being received. The communication system 100 according to the present modification is of a type similar to that of FIG. 1, the radio apparatus 20 according to the present modification is of a type similar to that of FIG. 2, and the receiving apparatus 30 according to the present modification is of a type similar to FIG. 4. Also, the instruction unit 46 according to the present modification is not provided with the fixed value storage 52 of FIG. 7. A description is given here centering around different features.

If the notification regarding the state where STF is being received is received while the notification regarding the state where no packet signals is being received is received, the initial value selector 50 of FIG. 7 extracts the most recent value from the most-recent value storage 54 and instructs the RF unit 22 to use the most recent value. This corresponds to starting to perform control by the gain control unit 32 using the most recent value as the initial value when the receiving of packet signal starts. If, on the other hand, the notification regarding the state where no packet signals is being received is received while the packet signal is being received, the initial value selector 50 of FIG. 7 extracts again the same most recent value from the most-recent value storage 54 and instructs the RF unit 22 to use the same most recent value. This corresponds to starting to perform another new control by the gain control unit 32 using the most recent value as the initial value when the receiving of packet signal starts.

Figure 16:
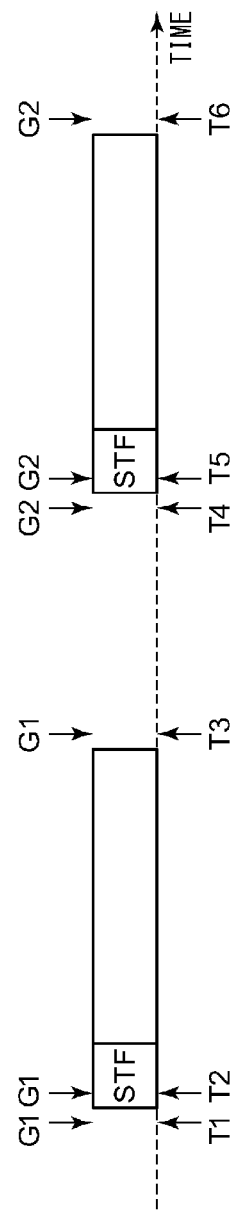
FIG. 16 shows an operational overview of an instruction unit according to a modification of an exemplary embodiment.

Such processings are now described hereunder based on FIG. 16. FIG. 16 shows an operational overview of an instruction unit 46 according to a modification of the exemplary embodiment. At "T1", the gain is "G1" that is the most recent value. Next, at "T2", too, the gain is "G1" and the most recent value is used. During a period of STF, the gain is controlled with the "G1" as the initial value, and then the remaining period is amplified with the resulting gain. "T3" is the timing with which the receiving of packet signal ends. The gain at this time is set to the then-most recent value "G1".

In a period during which a signal other than the packet signal is being received, the gain is controlled with the "G1" as the initial value. The gain is updated to the "G2" at "T4". The "G2" is now the most recent value. At "T5", too, the gain is "G2". "T6" is the timing with which the receiving of packet signal ends again. The gain at this time is set to the then-most recent value "G2".

A description is now given of another modification of the exemplary embodiment. Similar to the above, the other modification of the exemplary embodiment relates also to the communication system that carries out both the inter-vehicular communication and the road-to-vehicle communication and particularly relates to a receiving function implemented in a base station apparatus and terminal apparatuses in the communication system (hereinafter referred to as "receiving apparatus" as described above). In the exemplary embodiments, the receiving apparatus is equipped with a single antenna. On the other hand, the receiving apparatus according to another modification is equipped with a plurality of antennas. The communication system 100 according to another modification is of a type similar to that of FIG. 1, and the radio apparatus 20 transmits packet signals from one of the plurality of antennas. A description is given here centering around features different from the exemplary embodiments.

Figure 17:
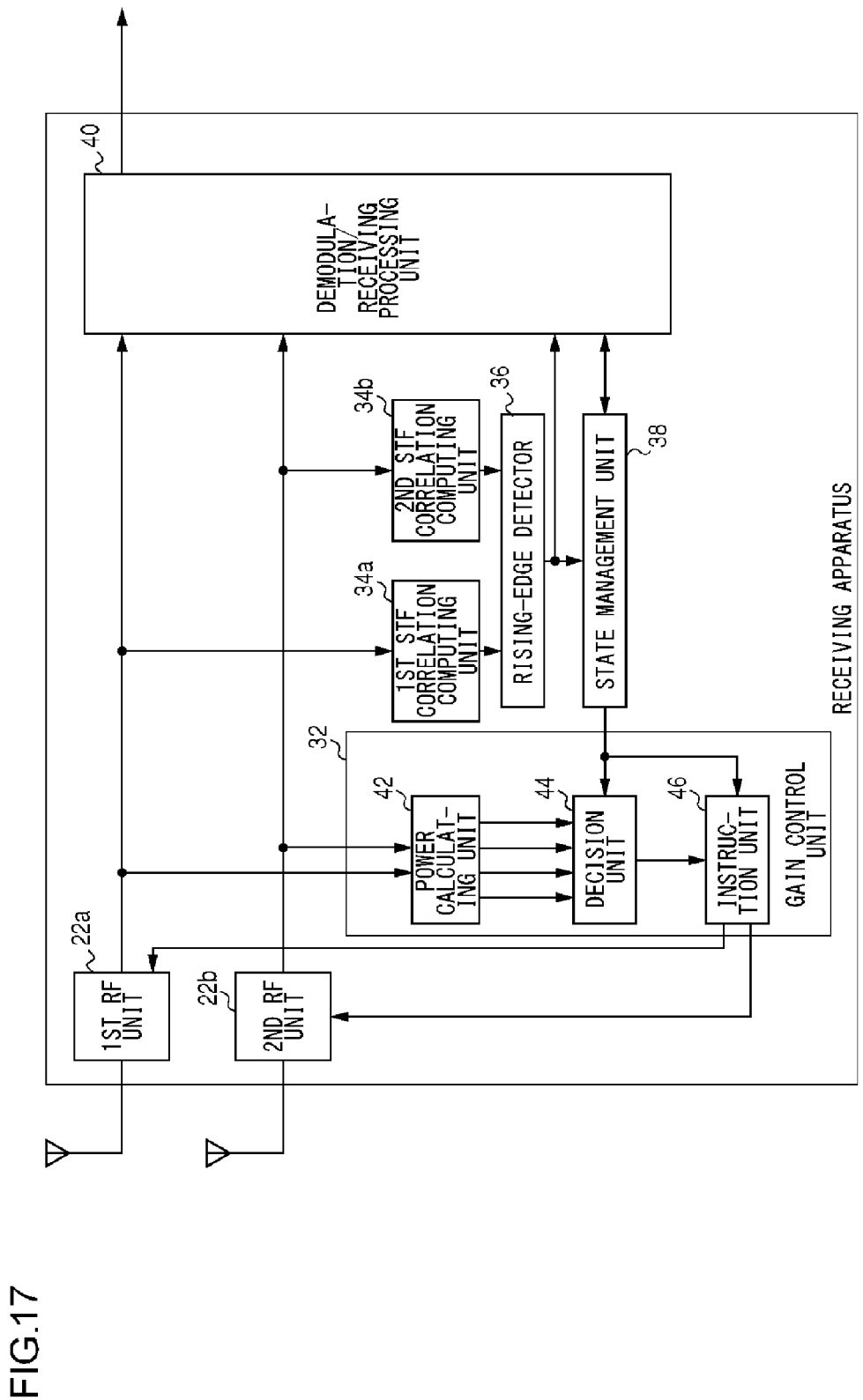
FIG. 17 shows a structure of a receiving apparatus according to another modification of an exemplary embodiment.

FIG. 17 shows a structure of a receiving apparatus 30 according to another modification of the exemplary embodiment. The receiving apparatus 30 includes a first RF unit 22*a* and a second RF unit 22*b*, which are generically referred to as "RF unit 22" or "RF units 22", a gain control unit 32, a first STF correlation unit 34a and a second STF correlation unit 34b, which are generically referred to as "STF correlation unit 34" or "STF correlation units 34", a rising-edge detector 36, a state management unit 38, and a demodulation/receiving processing unit 40. The gain control unit 32 includes a power calculating unit 42, a decision unit 44, and an instruction unit 46.

The RF units 22 are so provided that each of the RF units 22 is associated with each of the plurality of antennas on a one-to-one manner. The number of antennas is two in this example but may be three or more. The RF units 22 are so provided that the number of RF units 22 corresponds to the number of antennas. The power calculating unit 42 receives the inputs of the amplified baseband signals from the respective RF units 22. The power calculating unit 42 derives an average value of each baseband signal over the first average period and an average value thereof over the second average period. Outputted here are not only the average value of the baseband signal over the first average period and the average value thereof over the second average period fed from the first RF unit 22a but also the average value of the baseband signal over the first average period and the average value thereof over the second average period fed from the second RF unit 22b.

Upon receiving the notification regarding the state where STF is being received, the decision unit 44 selects a plurality of average values taken over the first average period. Upon receiving the notification regarding the state where no packet signals is being received, the decision unit 44 selects a plurality of average values taken over the second average period. In the former case, the average value of the baseband signal over the first average period fed from the first RF unit 22a and the average value thereof over the first average period fed from the second RF unit 22b are selected. In the latter case, the average value of the baseband signal over the second average period fed from the first RF unit 22a and the average value thereof over the second average period fed from the second RF unit 22b are selected.

If STF is being received, the decision unit 44 will select either one of them. For example, the larger one of the average value the baseband signal over the first average period fed from the first RF unit 22a and the average value thereof over the first average period fed from the second RF unit 22b is selected. The decision unit 44 performs the processing, similar to that of the exemplary embodiment, on the selected average value. If no packet signals is being received, the decision unit 44 will select either one of them. For example, the larger one of the average value the baseband signal over the second average period fed from the first RF unit 22a and the average value thereof over the second average period fed from the second RF unit 22b is selected. The decision unit 44 performs the processing, similar to that of the exemplary embodiment, on the selected average value. In these cases, the decision unit 44 may select the smaller one them in the both cases. Or the decision unit 44 may select the larger one of them in one of the above cases and may select the smaller one of them in the other of the above cases. Note that a statistical processing such as averaging may be done instead of the selection made as above.

The STF correlation computing units 34 receive the inputs of the amplified baseband signals from the RF units 22, respectively. Each STF correlation computing unit 34 sequentially outputs correlation values to the rising-edge detector 36. The rising-edge detector 36 receives the inputs of correlation values from the STF correlation computing unit 34, respectively. The rising-edge detector 36 detects the receiving of STF in the packet signal. In so doing, the rising-edge detector 36 may select any of the correlation values and then perform the processing, similar to that of the exemplary embodiment, on the selected average value or may perform the processing, similar to that of the exemplary embodiment, on a plurality of correlation values and then select any of the processed correlation values. Note that the rising-edge detector 36 may select the large one of them and/or may select a correlation value whose detection timing is earlier. Further, the rising-edge detector 36 may select the same one of them selected by the decision unit 44. Note also that a statistical processing such as averaging may be done instead of the selection made as above.

By employing the exemplary embodiments of the present invention, different controls are performed depending on a case when a known signal is received and a case when a signal other than the packet signal is received. Thus, the gain suited to the received packet signal can be set. Since the gain suited to the received packet signal is set, the receiving quality can be improved. Also, the length of an average period is changed depending on the case when a known signal is received or the case when a signal other than the packet signal is received. Thus, the gains suited to the respective cases can be obtained. Since average values suited to the respective cases are obtained, the accuracy in the setting of gain can be improved. The average period when the signal other than the packet signals is received is set longer than that when the known signal is received, so that adverse effect of noise can be reduced. Since the adverse effect of noise is reduced, the processing can be stabilized. The average period when the known signal is received is set shorter than that when the signal other than the packet signals is received, so that the gain can follow and conform closely to the variation in the received power. Since the gain follows and conforms closely to the variation in the received power, the accuracy in the setting of gain can be improved.

The length of the target value is changed depending on the case when the known signal is received or the case when the signal other than the packet signals are received, so that the gains suitable to the respective cases can be obtained. Since the gains suitable to the respective cases are obtained, the accuracy in the setting of gain can be improved. Also, the magnitude of the target value in the case when the signal other than the packet signals is received is set smaller than that in the case when the known signal is received, so that the amplification of interference signal can be suppressed. Since the amplification of interference signal is suppressed, the probability that packet signal will be deformed can be reduced even though when the packet signal is received. Since the probability of the packet signal will be deformed is reduced, the receiving quality can be improved. Also, the magnitude of the target value in the case when the known signal is received is set larger than that in the case when the signal other than the packet signals is received. Thus, packet signals to be demodulated can be sufficiently amplified. Since the packet signals to be demodulated can be amplified sufficiently, the receiving quality can be improved.

Also, the initial value is changed depending on the case when the known signal is received or the case when the signal other than the packet signals is received, so that the gain suited to the received packet signal can be set. Also, when the known signal is received, control is started using a predetermined gain as the initial value. Thus the deviation in gain for the packet signal received with various powers can be reduced. Since the deviation in gain is reduced, the receiving quality can be improved. When the signal other than the packet signals is received, control is started using the gain, which is used in the past for the signal other than the packet signals, as the initial value, thereby preventing the setting of the maximum gain. Since the setting of the maximum gain is prevented, the amplification of interference signal can be suppressed. Also, when the receiving of packet signal has been completed, control is started using the final value of the gain, used before said packet signal has been received, as the initial value. Thus a simplified processing can be executed.

Also, the gain suited to the received packet signal is set corresponding respectively to the case when the known signal is received and the case when the signal other packet signals is received. Also, the update frequency in the case when the known signal is received is set higher than that in the case when the signal other than the packet signals is received, so that the gain conforming closely to the variation in the received power can be set. Since the update frequency in the case when the signal other than the packet signals is received is set lower than that in the case when the known signal is received, the processing amount can be reduced. Since the amount of consumption is reduced, the power consumption can be reduced. When the known signal is received, the use of the gain is instructed for each interval based on the average period and the response period at the amplifier, so that the gain can be instructed quickly. When the signal other than the packet signals is received, the use of the gain is instructed based on the average period and the response period at the amplifier, so that the update period can be made longer. Also, the average period in the case when the signal other than the packet signals is received is set longer than that in the case when the known signal is received, so that the update interval can be made longer.

Also, the width of the target range in the case where the gain is smaller than the maximum value is made to differ from that in the case where the gain is the maximum value, so that the gain suited to the received packet signal can be set. Also, the width of the target range where the gain is the maxim value is set wider than that where the gain is smaller than the maxim value. Thus, the average value is more likely to be included in the target range when the gain is at the maximum value. Since the average value is more likely to be included in the target range when the gain is at the maximum value, the control of the gain can be stopped. Since the control of the gain is stopped, the processing amount can be reduced. Since the control of the gain is stopped, a large value can be kept as the gain. Since a large value can be kept as the gain, the packet signal can be sufficiently amplified. When the gain is smaller than the maximum value, the width of the target range is made wider than the previous width of the target range before the end timing of the known signal. Thus the average value is more likely to be included in the target range. Since the average value is more likely to be included in the target range, the probability that the demodulation of the packet signal will be stopped can be reduced.

In the respective cases where the known signal is received and where the signal other than the packet signals is received, different controls performed while the same most recent value is used. Thus the gains suitable to the respective cases can be set while the most recent propagation environment is reflected and taken into consideration. Also, when the gain is to be controlled, a larger average value is selected. Thus, the gain can be determined based on the larger average value. Since the gain is determined based on the larger average value, the probability that an overflow may occur in the analog-to-digital conversion can be reduced. Since the probability of overflow is reduced, the receiving quality can be improved. Also, when the gain is to be controlled, a smaller average is selected. Thus, the gain can be determined based on the smaller average value.

Since the gain is determined based on the smaller average value, the probability that an underflow may occur in the analog-to-digital conversion can be reduced. Since the probability of underflow is reduced, the receiving quality can be improved. Since a larger average value or a smaller larger value is selected depending on a given condition, the gain suited to the condition can be determined. Also, any of a plurality of cross-correlation values is/are selected then the receiving of STF in the packet is detected, so that an increase in the processing amount can be suppressed. Since STF is selected after a plurality of STFs in the packet signals have been received and detected, the detection accuracy can be improved.

The present invention has been described based on the exemplary embodiments. The exemplary embodiments are intended to be illustrative only, and it is understood by those skilled in the art that various modifications to constituting elements and processes as well as arbitrary combinations thereof could be further developed and that such modifications and combinations are also within the scope of the present invention.

A general description of one embodiment of the present invention is as follows. That is, a receiving apparatus according to one embodiment of the present invention includes: a receiving unit for receiving a signal; an amplifier for amplifying the signal received by the receiving unit; and a control unit for controlling a gain in the amplifier based on a signal amplified by the amplifier and having the amplifier use the controlled gain. The control unit performs different controls on the signals received by the receiving unit, depending on a case when the received signal is a known signal placed in the beginning of packet signal or a case when the received signal is a signal other than the packet signal.

By employing this embodiment, the different controls are performed depending on the case when the received signal is a packet signal having a known signal placed in the beginning and the case when a signal other than the packet signal is received. Thus, the gain suited to the received packet signal can be set.

The control unit may include: an averaging unit for averaging the magnitude of signals amplified by the amplifier; and a decision unit for determining the gain such that the magnitude averaged by the averaging unit is brought close to a target value. The averaging unit may change an average period depending on a case when the signal received by the receiving unit is a packet signal having a known signal placed in the beginning or a case when the signal received by the receiving unit is a signal other than the packet signal. In this case, the average period is changed depending on the case when the known signal is received or the case when a signal other than the packet signal is received. In this embodiment, the average period is changed depending on the case when the known signal is received or the case when the signal other than the packet signals is received, so that the average values suited to the respective cases can be obtained.

The averaging unit may set the average period of the signal received by the receiving unit such that the average period of the signal other than the packet signal is longer than the average period of the known signal placed in the beginning of the packet signal. In this embodiment, the average period when the signal other than the packet signals is received is set longer than that when the known signal is received, so that adverse effect of noise can be reduced.

The control unit may include: an averaging unit for averaging the magnitude of signals amplified by the amplifier; and a decision unit for determining the gain such that the magnitude thereof averaged by the averaging unit is brought close to a target value. The decision unit may change the magnitude of the target value, depending on the case when the signal received by the receiving unit is a known signal placed in the beginning of packet signal or the case when the signal received by the receiving unit is a signal other than the packet signal. In this embodiment, the length of the target value is changed depending on the case when the known signal is received or the case when the signal other than the packet signals are received, so that the gains suitable to the respective cases can be obtained.

The decision unit may set the target values of the signals received by the receiving unit such that the magnitude of the target value of the signal other than the packet signal is smaller than the magnitude of the target value of the known signal placed in the beginning of packet signal. In this embodiment, the magnitude of the target value in the case when the signal other than the packet signals is received is set smaller than that in the case when the known signal is received, so that the amplification of interference signal can be suppressed.

Another embodiment of the present invention relates also to a receiving apparatus. The receiving apparatus includes: a receiving unit for receiving a signal; an amplifier for amplifying the signal received by the receiving unit; and a control unit for controlling a gain in the amplifier based on a signal amplified by the amplifier and having the amplifier use the controlled gain. When the signal received by the receiving unit is a known signal placed in the beginning of packet signal, the control unit starts to perform control using a predetermined initial value; when the receiving unit stops receiving the packet signal, the control unit performs another control using the predetermined initial value.

By employing this embodiment, the initial value is changed depending on the case when the known signal is received or the case when the signal other than the packet signals is received, so that the gain suited to the received packet signal can be set.

The control unit may use a final value of the gain used before the packet signal has been received, as the initial value. In this embodiment, when the signal other than the packet signals is received, control is started using the gain, which is used in the past for the signal other than the packet signals, as the initial value, thereby preventing the setting of the maximum gain.

Still another embodiment of the present invention relates to a receiving apparatus. The receiving apparatus includes: a receiving unit for receiving a signal; an amplifier for amplifying the signal received by the receiving unit; and a control unit for controlling a gain in the amplifier based on a signal amplified by the amplifier and having the amplifier use the controlled gain. The control unit changes frequency, at which the gain is updated, depending on a case when the signal received by the receiving unit is a known signal placed in the beginning of packet signal or a case when the signal received by the receiving unit is a signal other than the packet signal.

By employing this embodiment, the update frequency is changed depending on the case when the known signal is received or the case when the signal other than the packet signals is received. Thus the gain suitable to the received packet signal can be set.

The control unit may set the frequency, at which the gain is updated, such that the frequency of update in the signal other than the packet signal is lower than the frequency of update in the known signal placed in the beginning of packet signal. In this embodiment, the update frequency when the known signal is received is set higher than that when the signal other than the packet signals is received, so that the gain conforming closely to the variation in the received power can be set.

The control unit may include: an averaging unit for averaging the magnitude of signals amplified by the amplifier; a decision unit for determining the gain such that the magnitude thereof averaged by the averaging unit is brought close to a target value; and an instruction unit for instructing the amplifier to use the gain determined by the decision unit. When the signal received by the receiving unit is a known signal placed in the beginning of packet signal, the instruction unit may instruct use of the gain for each interval, based on an average period in the averaging unit and a response period at the amplifier; when the signal received by the receiving unit is the signal other than the packet signal, the instruction unit may instruct use of the gain for each interval based on the average period in the averaging unit, the response period at the amplifier and waiting time period at the amplifier. In this embodiment, when the known signal is received, the use of the gain is instructed for each interval based on the average period and the response period at the amplifier, so that the gain can be instructed quickly.

The averaging unit may set the average period of the signals received by the receiving unit such that the average period of the signal other than the packet signal is longer than the average period of the packet signal having the known signal placed in the beginning. In this embodiment, the average period when the signal other than the packet signals is received is set longer than that when the known signal is received, so that the update interval can be made longer.

Still another embodiment of the present invention relates also to a receiving apparatus. The receiving apparatus includes: a receiving unit for receiving a packet signal having a known signal placed in the beginning; an amplifier for amplifying the packet signal received by the receiving unit; and a control unit for controlling a gain in the amplifier based on the known signal in the packet signal amplified by the amplifier and having the amplifier use the controlled gain. The control unit includes: an averaging unit for sequentially averaging the magnitude of a signal amplified by the amplifier in a period shorter than that of the known period; and a decision unit for adjusting the gain until when the magnitude thereof averaged sequentially by the averaging unit lies within a target range and for fixing the gain when the magnitude thereof averaged sequentially by the averaging unit lies within the target range. The decision unit sets the widths of the target range such that the width thereof in a case where the gain is smaller than a maximum value differs from that in a case where the gain is the maximum value.

By employing this embodiment, the width of the target range in the case where the gain is smaller than the maximum value is made to differ from that in the case where the gain is the maximum value, so that the gain suited to the received packet signal can be set.

The decision unit may set the widths of the target ranges such that the width thereof in the case where the gain is the maximum value is larger than that in the case where the gain is smaller than the maximum value. In this embodiment, the width of the target range where the gain is the maxim value is set wider than that where the gain is smaller than the maxim value. Thus, the average value is more likely to be included in the target range when the gain is at the maximum value.

When the gain is smaller than the maximum value, the decision unit may enlarge the width of the target range from the previous target range. When the gain is smaller than the maximum value, the width of the target range is made wider than the previous width of the target range before the end timing of the known signal. Thus the average value is more likely to be included in the target range.

What is claimed is:

1. A receiving apparatus comprising:
a receiving unit configured to receive a packet signal having a known signal;
an amplifier configured to amplify the packet signal received by the receiving unit; and
a control unit configured to control a gain in the amplifier based on the known signal in the packet signal amplified by the amplifier and configured to have the amplifier use the controlled gain,
the control unit including:
an averaging unit configured to sequentially average a magnitude of the packet signal amplified by the amplifier in a period shorter than a period of the known signal; and
a decision unit configured to adjust the gain until when the magnitude thereof averaged sequentially by the averaging unit lies within a target range and configured to fix the gain when the magnitude thereof averaged sequentially by the averaging unit lies within the target range,
wherein the decision unit sets the width of the target range such that the width thereof in a case where the gain is smaller than a maximum value differs from the width in a case where the gain is the maximum value.

2. The receiving apparatus according to claim 1, wherein the decision unit sets the width of the target range such that the width thereof in the case where the gain is the maximum value is larger than the width in the case where the gain is smaller than the maximum value.

3. The receiving apparatus according to claim 1, wherein, when the gain is smaller than the maximum value, the decision unit enlarges the width of the target range from a previous target range.

* * * * *